United States Patent [19]
Walkup et al.

[11] Patent Number: 6,017,234
[45] Date of Patent: Jan. 25, 2000

[54] ZIF PGA SOCKET

[75] Inventors: William B. Walkup, Hillsboro, Oreg.; Ming-Lun Szu, Taipei, Taiwan

[73] Assignee: Hon Hai Precision Ind. Co., Ltd., Taipei Hsien, Taiwan

[21] Appl. No.: 09/256,639

[22] Filed: Feb. 24, 1999

[51] Int. Cl.[7] .................................................. H01R 11/22
[52] U.S. Cl. ............................................................ 439/266
[58] Field of Search .................................... 439/259, 342, 439/746, 876, 263, 264, 265, 266, 268, 269, 270

[56] References Cited

U.S. PATENT DOCUMENTS

| | | |
|---|---|---|
| 5,443,591 | 8/1995 | Tsai ........................................... 439/342 |
| 5,489,218 | 2/1996 | McHugh .................................... 439/342 |
| 5,679,020 | 10/1997 | Lai et al. .................................. 439/342 |
| 5,692,920 | 12/1997 | Banakis et al. .......................... 439/342 |

Primary Examiner—Khiem Nguyen
Assistant Examiner—V. Johnson
Attorney, Agent, or Firm—Wei Te Chung

[57] ABSTRACT

A ZIF PGA socket includes a mother housing and two daughter housings slidably received in the mother housing. The daughter housings are simultaneously moved in the mother housing by a cam which is rotatably received between the mother housing and the daughter housings. The thickness of the socket is substantially equal to the thickness of each of the cam lever, the mother housing, and the daughter housings.

17 Claims, 13 Drawing Sheets

ZIF PGA SOCKET

BACKGROUND OF THE INVENTION

1. Field of the Invention

The present invention relates to a socket for a CPU module, and especially to a low profile two-layer ZIF PGA socket whereby a related CPU module may be mounted thereto with zero insertion force and the ZIF PGA socket may be operated to electrically connect with the CPU module without moving the CPU module in a lateral direction.

2. The Prior Art

Conventional ZIF PGA sockets normally comprise a cover defining a plurality of upper passageways therein and slidably engaging with a base which defines a corresponding number of lower passageways retaining contacts therein. The upper passageways and the lower passageways are in constant communication with each other. A cam is received in a space defined between the cover and the base and operative to move the cover along the base thereby positioning the socket at either a loosened status ready for insertion of pins of the CPU or a tightened status forcing the pins of the CPU to abut against the corresponding contacts. When the socket is in the loosened status, the pins of the CPU are inserted into the upper passageways and the lower passageways with a substantially zero insertion force, but are not in electrical contact with the contacts retained in the lower passageways. The cam is then operated to drive the cover to move laterally along the base thereby urging the pins of the CPU module to electrically connect with the contacts of the base. The CPU module is moved by the cover of the socket when the socket is changed from the loosened status to the tightened status.

The CPU module is commonly engaged with a heat sink for heat dissipation. However, due to the high density of modularization, the CPU module is heavy and has a large dimension. Thus, the addition of the heat sink causes the assembly of the CPU module and the heat sink to be larger and heavier whereby operation of the cam to laterally move the CPU module is laborious.

To solve the problem, U.S. patent application Ser. No. 09/138,188, which is assigned to the same assignee as the present invention, discloses a three-layer ZIF socket comprising an upper layer defining a plurality of first passageways for receiving CPU pins when the CPU rests thereon, a lower layer defining a plurality of second passageways for receiving soldering tails therein, and a middle layer movably retained between the upper and lower layers and defining a plurality of third passageways for receiving bridging terminals therein. Each soldering tail has a lower portion soldered on a printed circuit board and an upper portion extends into the corresponding third passageway. The upper and middle layers are dimensioned so that the CPU pin is positioned in the first and third passageways. The bridging terminal is movable by the middle layer to be selectively displaced between a first position where the soldering tail and the CPU pin are not connected, and a second position where the soldering tail and the CPU pin are electrically connected by the bridging terminal. In such a three-layer socket, the CPU pins remain stationary yet can still electrically connect with the printed circuit board via movement of the middle layer. However, the middle layer is apt to warp after manufacture due to its large area thereby adversely affecting the movement between the upper and bottom layers. Moreover, such a three-layer structure requires two kinds of terminals (soldering tails and bridging terminals) which increases manufacturing costs. Additionally, the profile of the three-layer socket is higher than that of the two-layer socket and violates the miniaturization trend of the computer industry.

Hence, it is requisite to provide a low profile ZIF socket which does not move the CPU module laterally when the CPU module is changed between the tightened status and the loosened status.

SUMMARY OF THE INVENTION

The primary purpose of the present invention is to provide a low profile ZIF PGA socket which has a cam lever rotatably received between a mother housing and two daughter housings which are slidably received in the mother housing so that the thickness of the socket is substantially equal to the thickness of each of the cam lever, the mother housing, and the daughter housings.

The second purpose of the present invention is to provide a low profile ZIF PGA socket which has a cam lever rotatably received between a mother housing and a daughter housing which is slidably received in the mother housing. The thickness of the socket is substantially equal to the thickness of each of the cam lever, the mother housing, and the daughter housing.

To fulfill the primary purpose, a ZIF PGA socket is provided which comprises a mother housing having a first recess and a hole defined in an edge of the recess, a beam exposing to the hole and the recess and a pivot extending from the beam. Two daughter housings are slidably received in the first recess of the mother housing and each daughter housing comprises a C-shaped head portion extending out of the mother housing and defining a second recess for loosely receiving the beam of the mother housing. The C-shaped head portions of the daughter housings are matingly configured to define a first reception space therebetween and together are movable along a same direction. A cam lever comprises a cam and a handle bar connected to the cam. The cam is rotatably received in the first reception space between the daughter housings and defines a hole for rotatably receiving the pivot of the mother housing. A first block and a second block extend from the cam and both are spaced away by the hole of the cam and the beam of the mother housing for respectively driving the configured daughter housings to move in opposite directions when the handle bar is manually operated in different directions.

To fulfill the second purpose, a ZIF PGA socket is provided which comprises a mother housing having a first recess and a hole defined in an edge of the recess, a beam exposing to the hole and the recess and a pivot extending from the beam. A daughter housing is slidably received in the first recess of the mother housing and comprises a head portion in which a reception hole is defined and two second recesses are defined in line at two opposite periphery portions of the reception hole for movably receiving the beam of the mother housing. A cam lever comprises a cam and a handle bar connected to the cam. The cam is rotatably received in the reception hole of the daughter housing and defines a hole for rotatably receiving the pivot of the mother housing. A first block and a second block extend from the cam and spaced away by the hole of the cam and the beam of the mother housing for respectively driving the daughter housing to move in opposite directions when the handle bar is manually operated in different directions.

DETAILED DESCRIPTION OF THE PREFERRED EMBODIMENT

Figure 1:
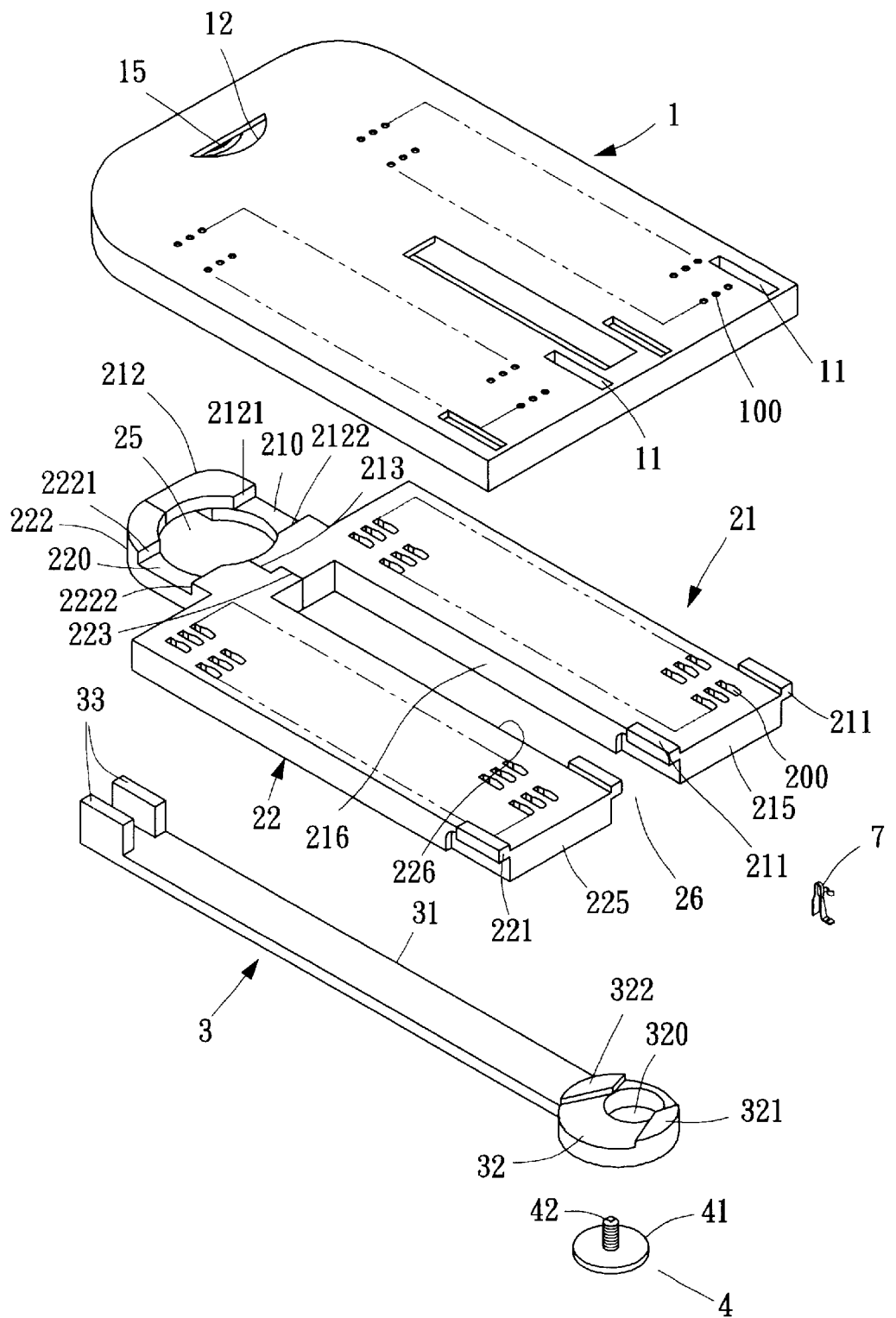
FIG. 1 is an exploded view of a ZIF PGA socket in accordance with a first embodiment of the present invention.
Figure 2:
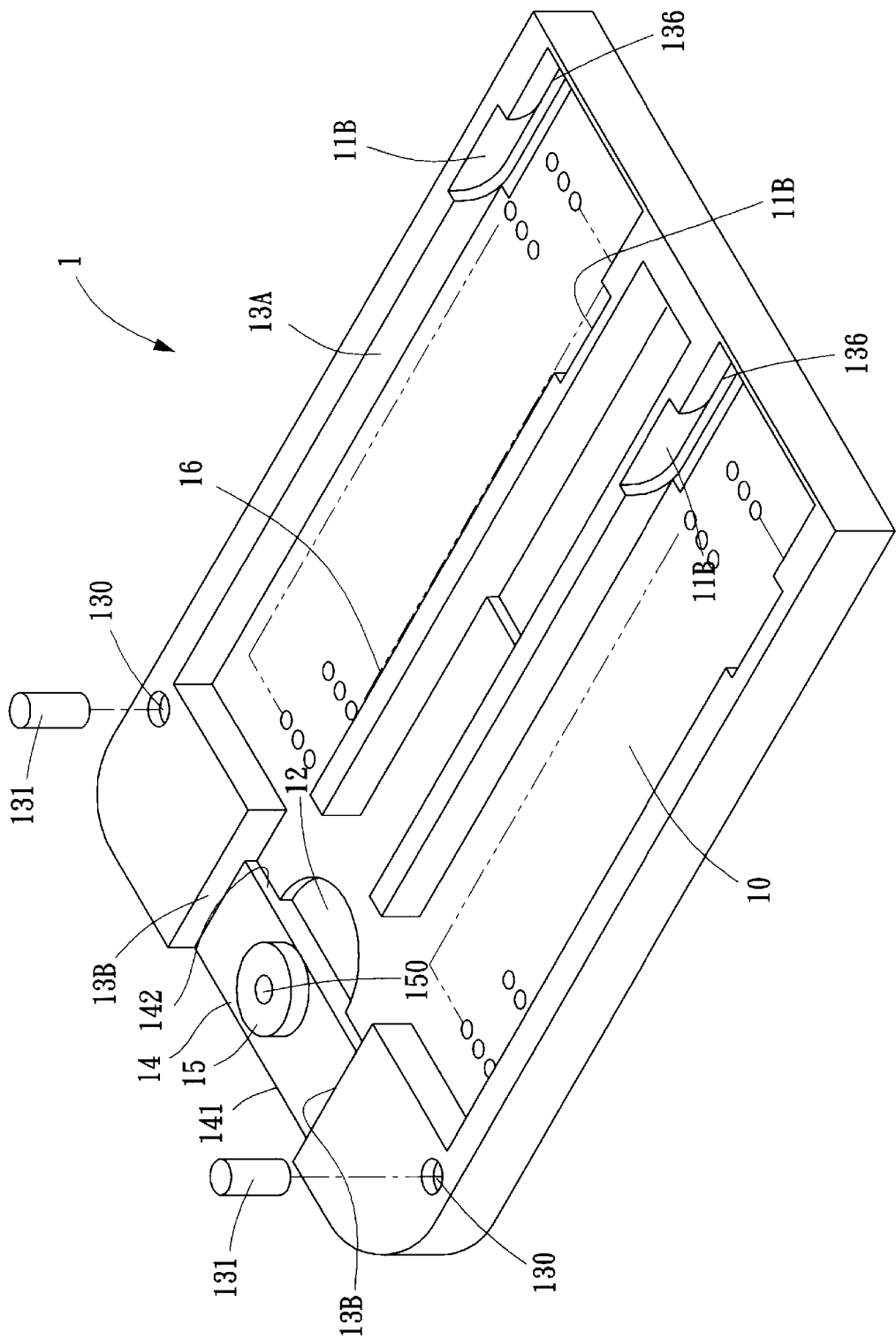
FIG. 2 is a perspective bottom view of the mother housing of FIG. 1.

Referring to FIGS. 1 and 2, a ZIF PGA socket in accordance with the present invention comprises a mother housing 1 defining a plurality of first passageways 100 for receiving pins of a CPU module (not shown) and a recess 10 at a bottom surface thereof, a first and a second daughter housings 21, 22 slidably received in the recess 10 and each defining a plurality of second passageways 200 each of which aligns with the corresponding first passageway 100 and receives a contact 7 therein.

The mother housing 1 defines four rectangular slots 11 near one side thereof and a semicircular slot 12 near an opposite side thereof. Particularly referring to FIG. 2, a U-shaped peripheral wall 13A having a first height is formed around the recess 10. Two blocks 13B having the same height of the U-shaped peripheral wall 13A are connected to two ends of the U-shaped peripheral wall 13A. A beam 14 having a second height less than the first height is connected between the two blocks 13B. The beam 14 has an outer side 141 exposing to exterior and an inner side 142 exposing to the recess 10 and the semicircular hole 12. A pivot 15 is formed on the beam 14 and defines a threaded hole 150 therein. A positioning recess 130 is defined in each block 13B for receiving a positioning post 131 which is to be positioned in a corresponding printed circuit board 9(FIGS. 9A to 9C) on which the socket is mounted. A U-shaped guiding rib 16 is formed on the bottom of the recess 10 and substantially extending from a central lateral portion of the U-shaped peripheral wall 13A. The rectangular hole 11 seen from the top surface of the mother housing 1 (FIG. 1) is not exactly the same as it is seen from an opposite surface thereof because a cutout 11B is defined in each corresponding portion of the U-shaped peripheral wall 13A opposite the position of each hole 11 defined in the top surface of the mother housing 1 and each cutout 11B is in communication with the hole 11. A platform 136 is formed in each corresponding portion of the U-shaped peripheral wall exposed to the corresponding hole 11, i.e., each hole is not directly defined through the mother housing 1 but partially blocked by the platform 136.

Figure 3A:
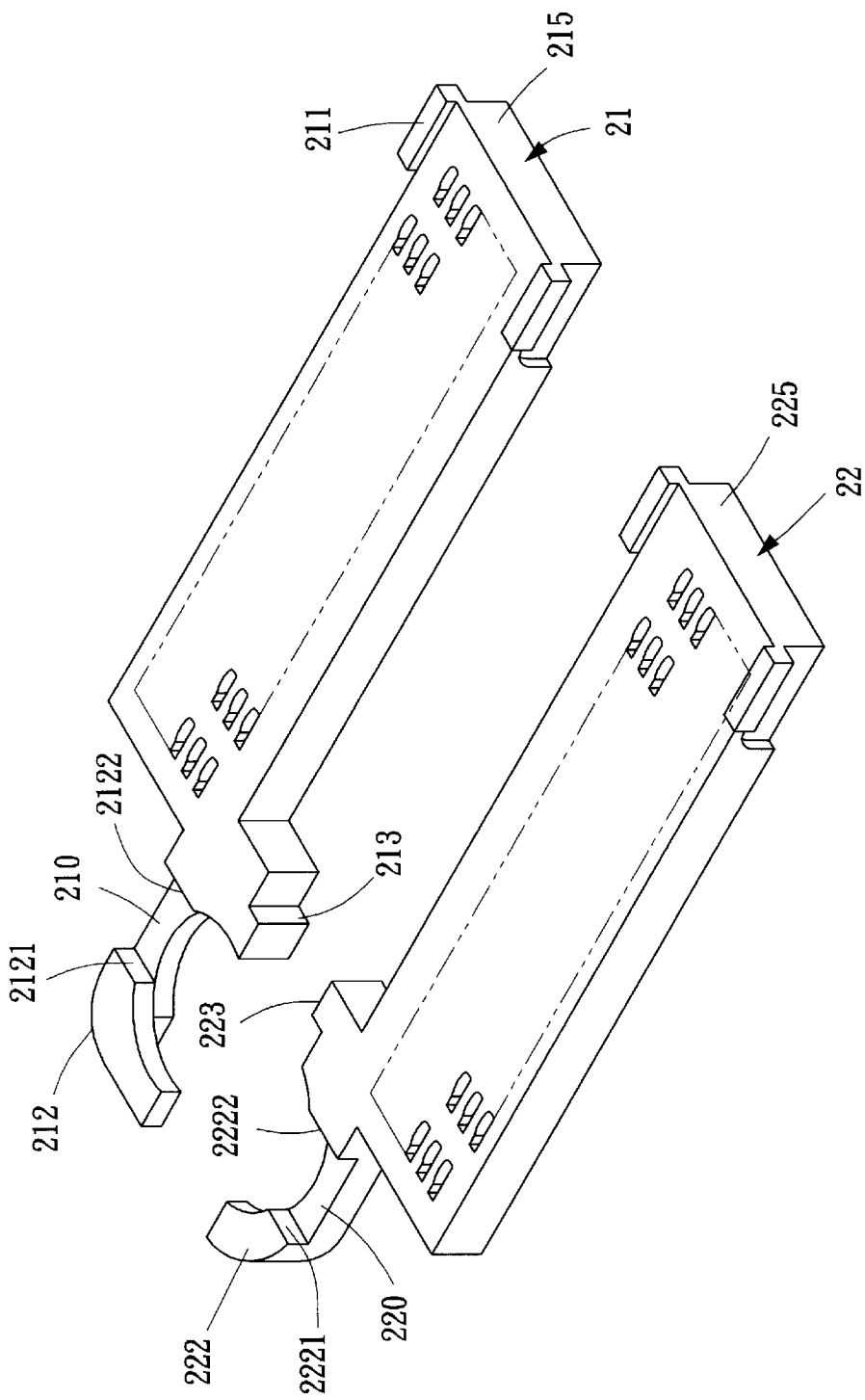
FIG. 3A is a perspective view of the first daughter housing of FIG. 1.

The first and second daughter housings 21, 22 each have two engagement tabs 211, 221 extending from two parallel sides thereof, a head 212, 222 extending from a corner thereof, and a rear side 215, 225 opposite the corresponding head 212, 222. Also referring to FIG. 3A, each head 212, 222 is substantially a C-shaped structure having a stepped edge 213, 223 mating with each other. A reception hole 25 is defined between the two C-shaped heads 212, 222 when the stepped edges 213, 223 are configured with each other (FIG. 1). The heads 212, 222 each define a recess 210, 220 substantially cross a middle portion thereof and the two recesses 210, 220 are arranged in line when the heads 212, 222 are configured with each other. The recesses 210, 220 are each defined between a first retaining wall 2121, 2221 and a second retaining wall 2122, 2222, wherein the second retaining walls 2122, 2222 are closer to the rear sides 215, 225 than the first retaining walls 2121, 2221. A rectangular space 26 is defined between two opposite sides 216, 226 of the daughter housings 21, 22 when the heads 212, 222 are configured with each other.

Figure 3B:
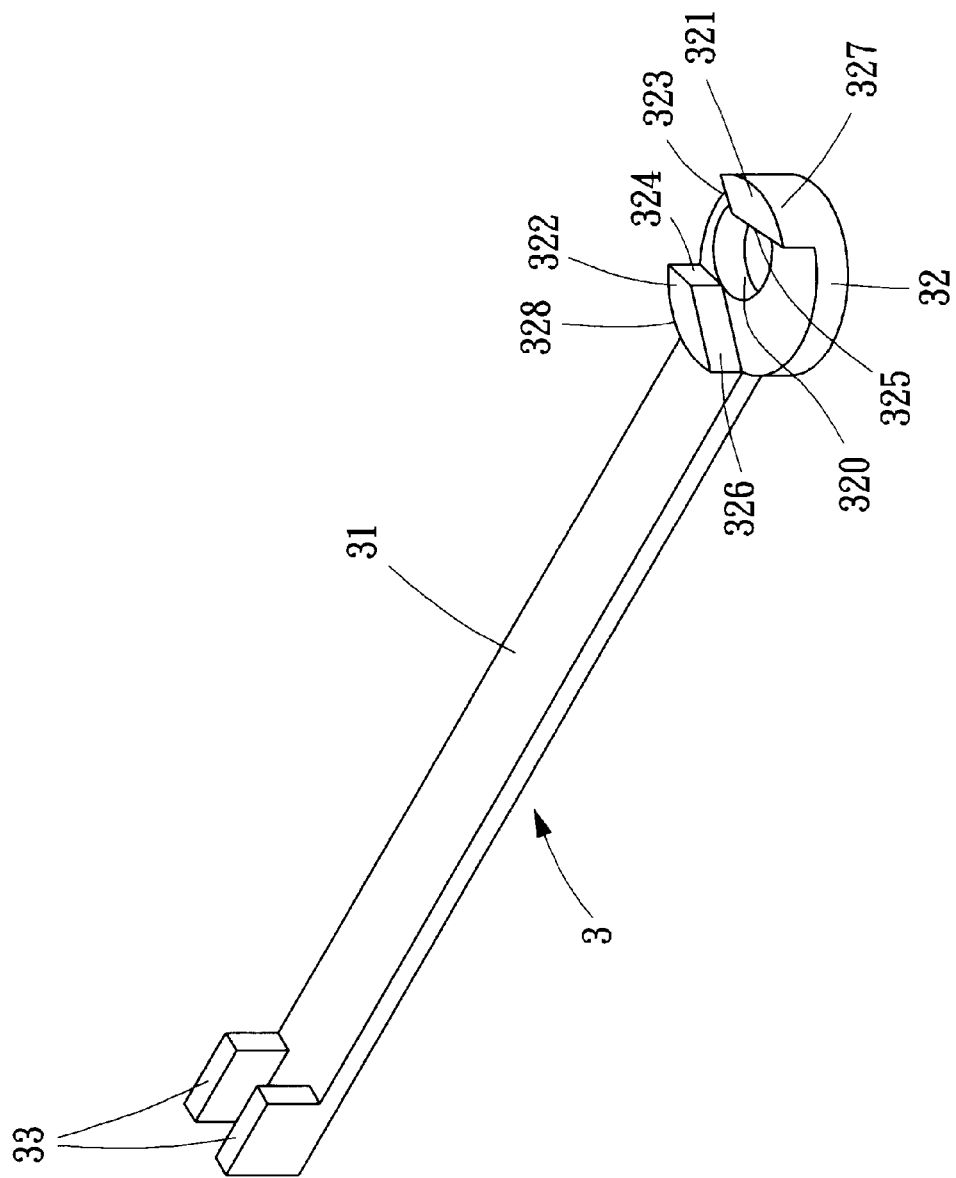
FIG. 3B is an enlarged perspective view of the cam lever of FIG. 1.

Also referring to FIG. 3B, a cam lever 3 comprises a handle bar 31 connected to a cam 32 which defines a hole 320 adapted to rotatably receive the pivot 15 of the mother housing 1 and comprises a first block 321 and a second block 322 spaced by the hole 320. Two protrusions 33 extend from one end of the handle bar 31 for facilitating manual operation. The first block 321 has two faces 323, 325 integrated with each other by an obtuse angle proximating to the hole 320 and a curved face 327 substantially extending from a periphery portion of the cam 32. Similarly, the second block 322 has two faces 324, 326 connected to each other with an obtuse angle proximating to the hole 320 and a curved face 328 substantially extending from a periphery portion of the cam 32. The face 323 of the first block 321 is parallel to the face 326 of the second block 322, while the face 325 of the first block is parallel to the face 324 of the second block 322.

A stud 4 has a circular cap portion 41 having a diameter greater than the diameter of the hole 320 of the cam 32 and a threaded rod portion 42 extending from a center of the circular cap portion 41 and threaded into the threaded hole 150 of the pivot 15 of the mother housing 1 for pivotably fixing the cam 32 to the pivot 15. Also referring to FIG. 5, the cam 32 defines a concave circular portion 329 at a bottom face thereof around the hole 320 for rotatably receiving the cap portion 41 of the stud 4.

Further referring to FIGS. 1 and 2, when assembling, the daughter housings 21, 22 are configured in the recess 10 of the mother housing 1, with the engagement tabs 211, 221 thereof being slidably received in corresponding slots 11 of the mother housing 1. Specifically, each engagement tab 211, 221 of the daughter housings 21, 22 is slidable along a corresponding platform 136 of the mother housing 1. The platforms 136 of the mother housing 1 position the daughter housings 21, 22 in a constant horizontal level. The rectangular space 26 defined between the daughter housings 21, 22 movably receives the U-shaped guiding rib 16 of the mother housing 1. The aligned recesses 210, 220 together loosely receive a lower portion of the beam 14. A portion of the reception hole 25 is substantially in alignment with the semicircular slot 12. After the daughter housings 21, 22 are fixed in the recess 10, the cam 32 of the cam lever 3 is then configured in the reception hole 25 of the daughter housings 21, 22. The hole 320 of the cam 32 rotatably receives the pivot 15 of the mother housing 1, the stud 4 rotatably fixes the cam 32 to the pivot 15, and the first and the second blocks 321, 322 respectively remain in opposite sides of the beam 14. With this configuration, the daughter housings 21, 22 are loosely retained in the mother housing 1 for providing tolerance in all directions to prevent unwanted stress therebetween when the socket experiences a soldering procedure in which thermal expansion of the mother housing 1 and the daughter housings 21, 22 may cause unwanted engagement between the mother housing 1 and the daughter housings 21, 22.

Figure 4:
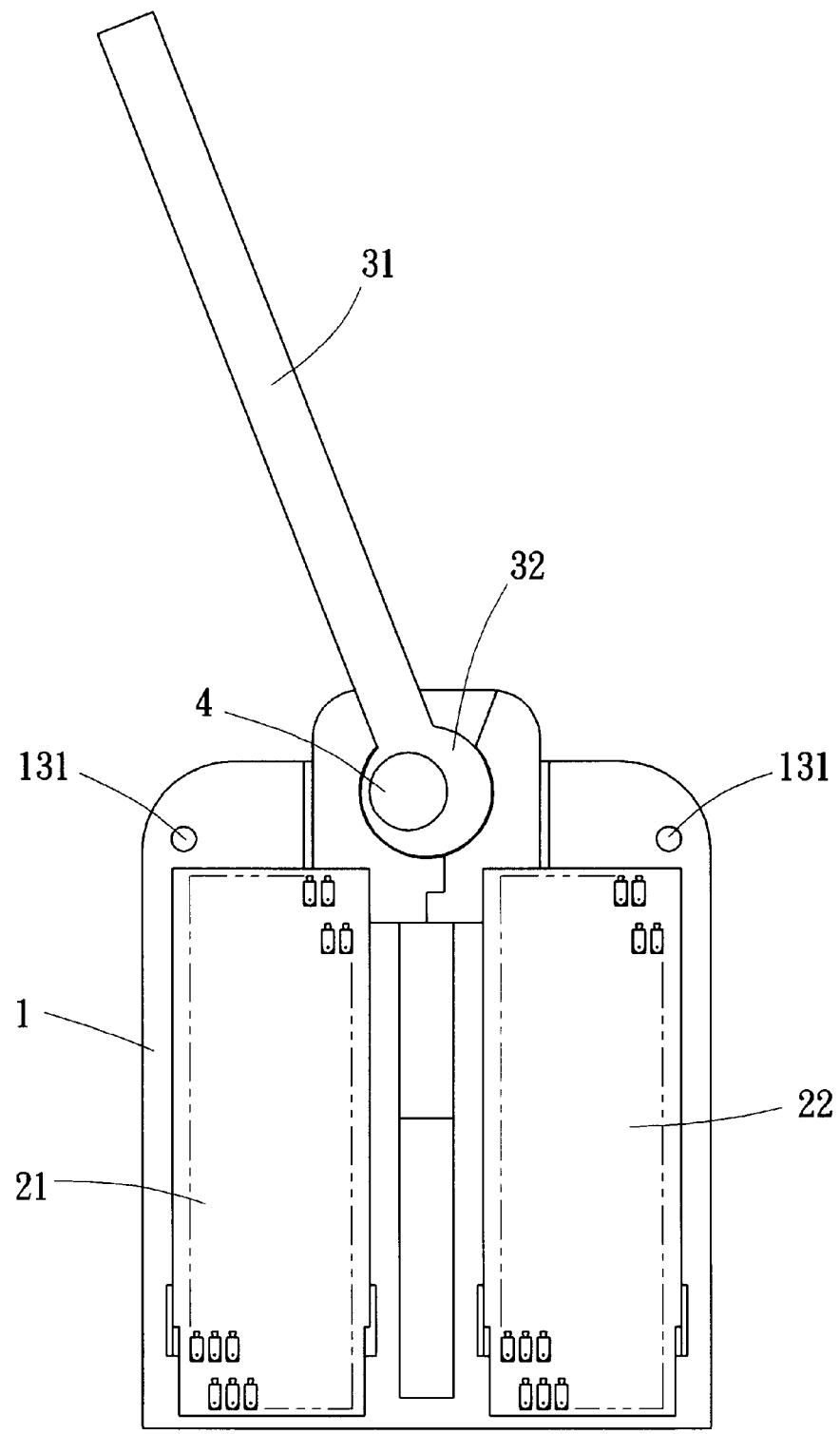
FIG. 4 is an assembled view of FIG. 1 showing the socket at a loosened status.
Figure 5:
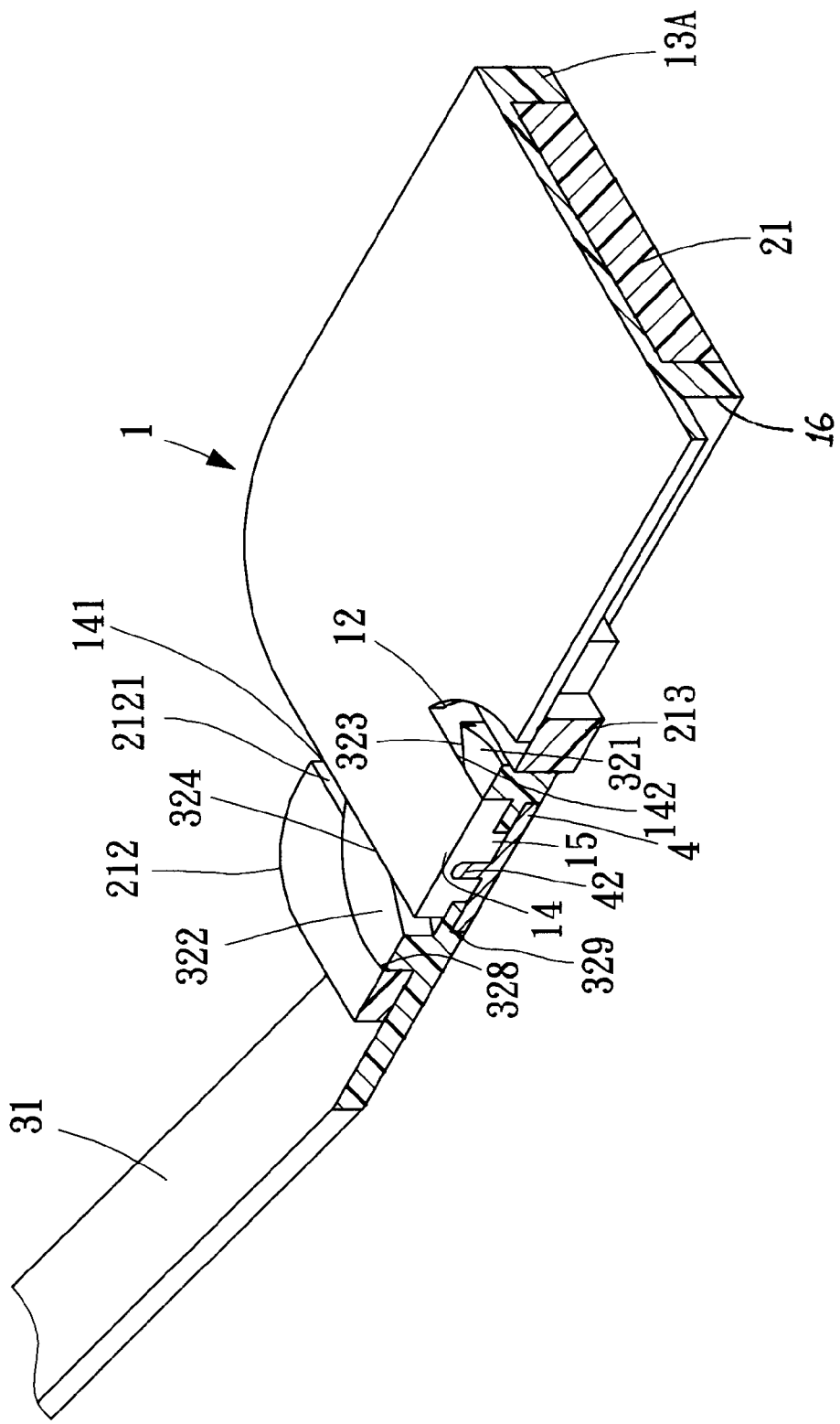
FIG. 5 is a partially cut-away view taken from reverse of FIG. 4.

Referring to FIGS. 4 and 5, the socket is assembled and operated in a loosened status in which a specific distance is defined between the outer side 141 of the beam 14 and the first retaining wall 2121 of the daughter housing 21 (also suitable for the first retaining wall 2221 of the other daughter housing 22 which is not shown in FIG. 5.) To reach this status, a portion of the curved face 328 of the second block 322 is rotatably moved by the handle bar 31 to drive the daughter housings 21, 22 to move in a direction from the rear sides 215, 225 to the headers 212, 222 until the face 324 of the second block 322 of the cam 32 is stopped by the outer side 141 of the beam 14 of the mother housing 1. In this status, the face 323 of the first block 321 is spaced away from the inner side 142 of the beam 14 of the mother housing 1. In this embodiment, a moving plane of the daughter housings 21, 22 are parallel to a rotation plane of the handle bar 31. Particularly referring to FIG. 5, the total thickness of the socket is substantially equal to the thickness of each of the cam lever 3, the mother housing 1, and the daughter housings 21, 22. Therefore, the socket of the present invention can achieve low profile requirement.

Figure 6:
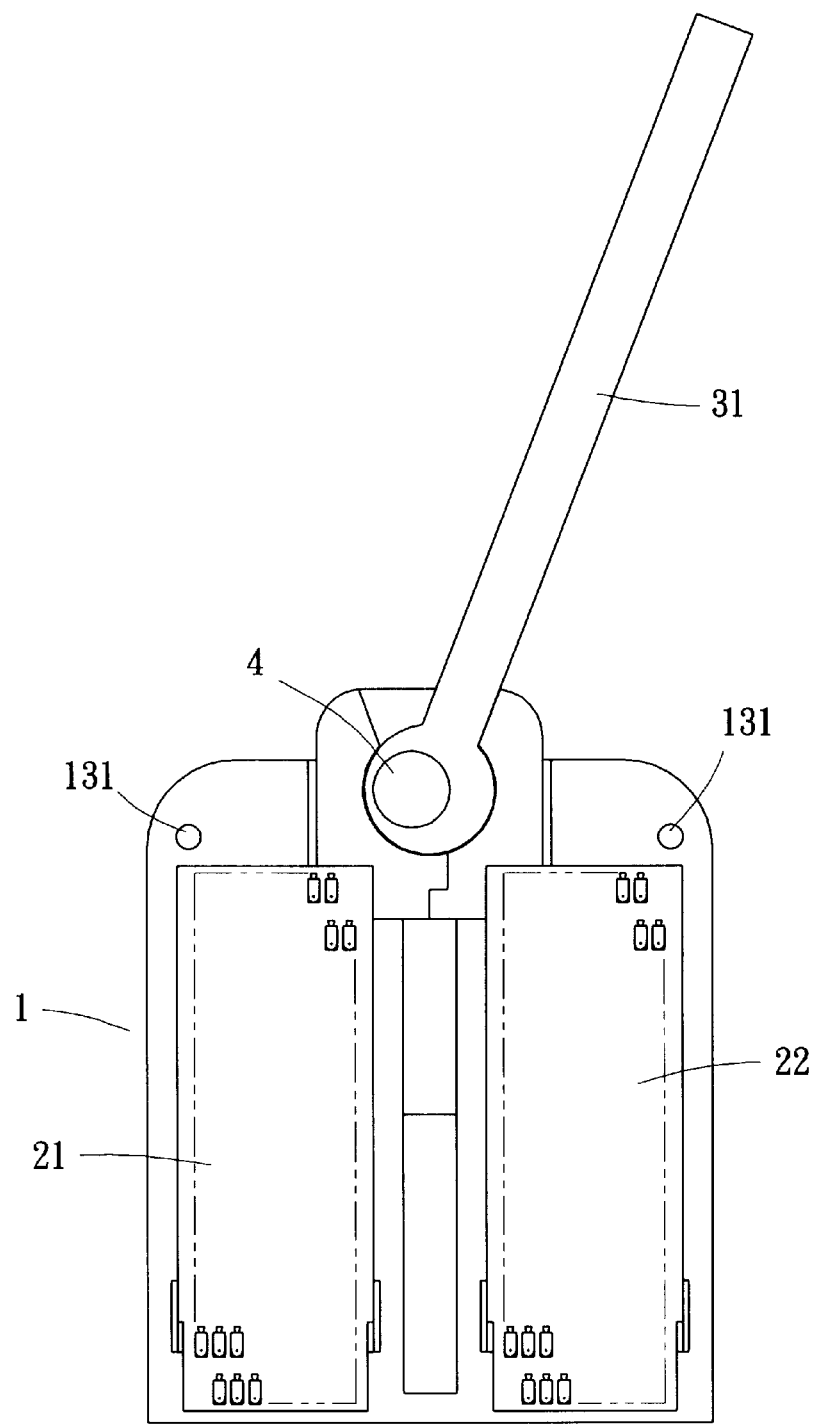
FIG. 6 is an assembled view of FIG. 1 showing the socket at a tightened status.
Figure 7:
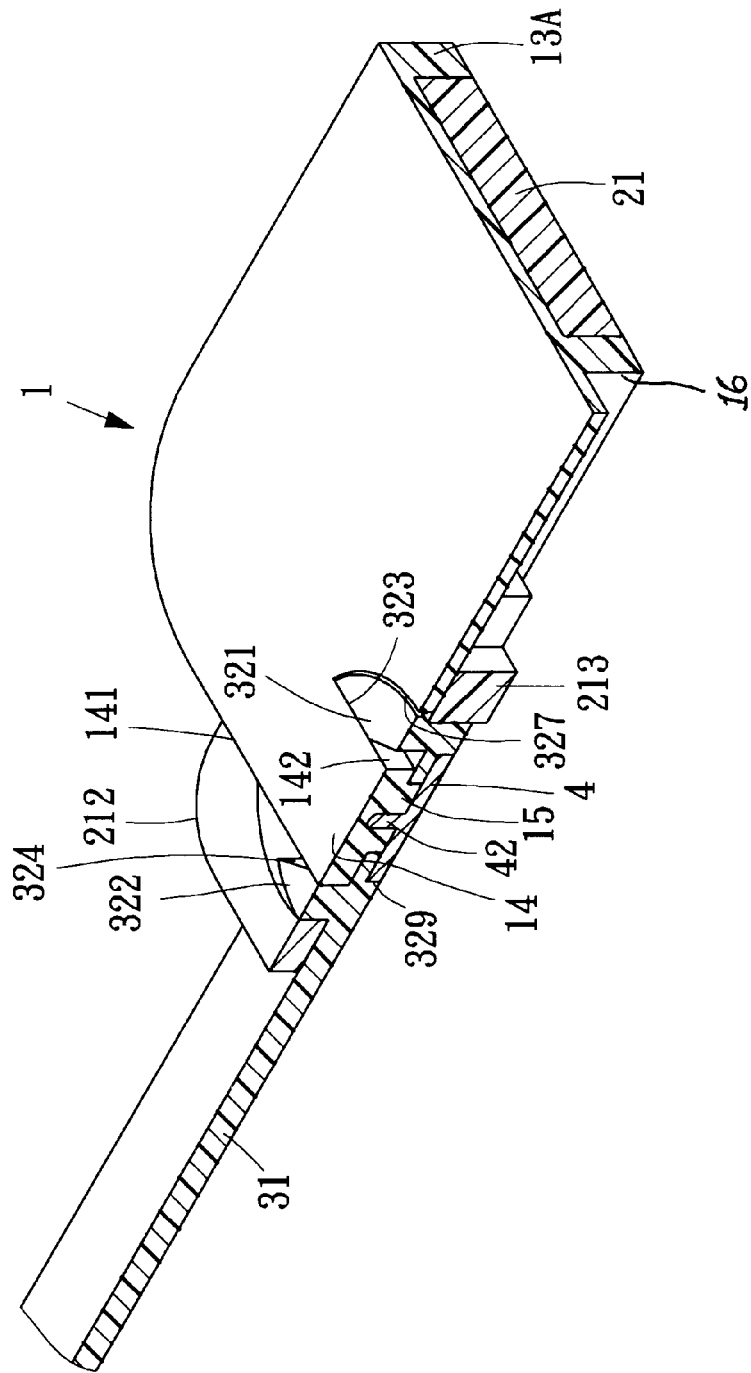
FIG. 7 is a partially cut-away view taken from reverse of FIG. 6.

Referring to FIGS. 6 and 7, the socket is operated in a tightened status in which the first retaining wall 2121 of the daughter housing 21 is moved to abut against the outer side 141 of the beam 14 (similarly, the first retaining wall 2221 of the other daughter housing 22 is also moved to abut against the outer side 141 of the beam 14, although it is not shown in FIG. 7.) To reach this status, a portion of the curved face 327 of the first block 321 is rotatably moved by the handle bar 31 to drive the daughter housings 21, 22 to move in a direction from the headers 212, 222 to the rear sides 215, 225 until the face 323 of the first block 321 of the first block 321 of the cam 32 is stopped by the inner side 142 of the beam 14 of the mother housing 1. In this status, the face 324 of the second block 322 of the cam 32 is spaced away from the outer side 141 of the beam 14 of the mother housing 1.

Figure 8:
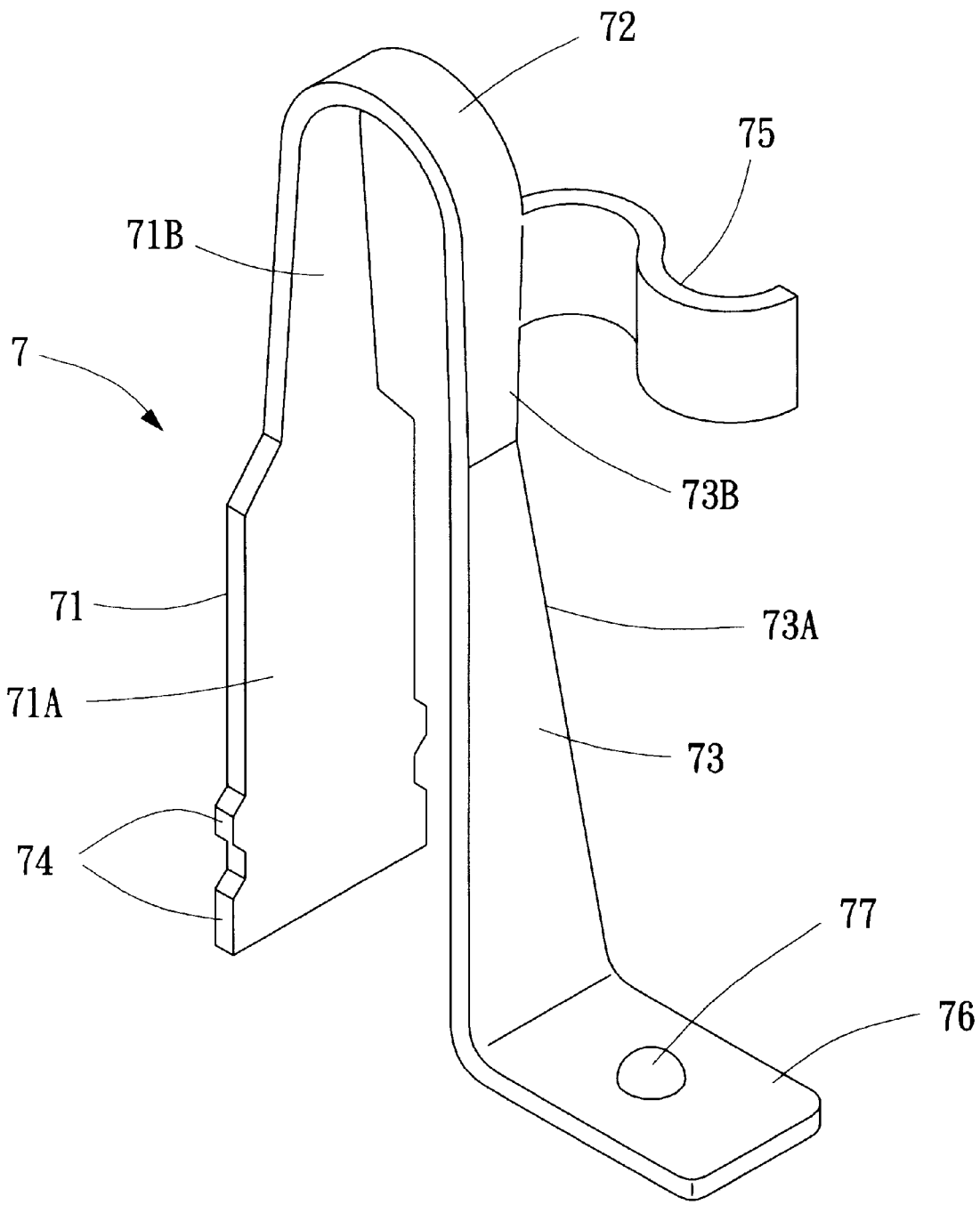
FIG. 8 is a perspective view of a contact used in the present invention.

Referring to FIG. 8, the contact 7 of the present invention comprises an engagement section 71 connected to a curved section 72 which is connected to a compliant section 73. The engagement section 71 comprises a lower portion 71A and an upper portion 71B which is narrower than the lower portion 71A. The lower portion 71A forms barbs 74 on opposite sides thereof for interferentially engaging with opposite inner walls of the corresponding second passageway 200. An S-shaped contacting portion 75 extends from a junction between the curved section 72 and the compliant section 73 for contacting with a CPU pin 8 (FIG. 11C). The compliant section 73 comprises a lower portion 73A, an upper portion 73B, and a soldering tail 76 extending from one end of the lower portion 73A and forming a dimple 77 on a central portion thereof. A concave portion of the dimple 77 receives a solder ball 79 ( FIG. 9A) used in ball grid array (BGA) soldering.

Figure 9A:
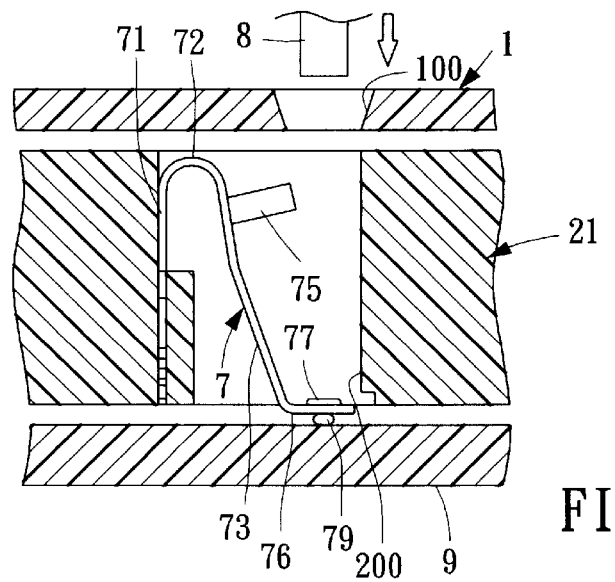
FIGS. 9A to 9C are schematic views showing the contact of FIG. 8 received in the daughter housing and deformed in accordance with the movement of the daughter housing.
Figure 9B:
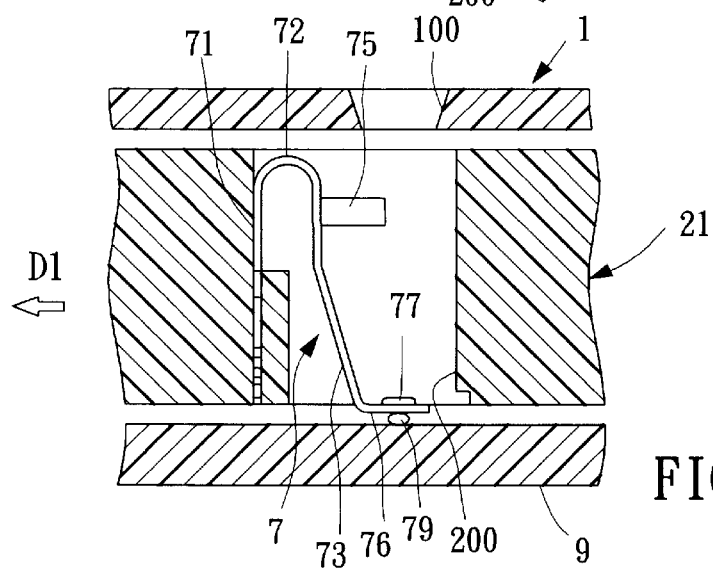
Figure 9C:
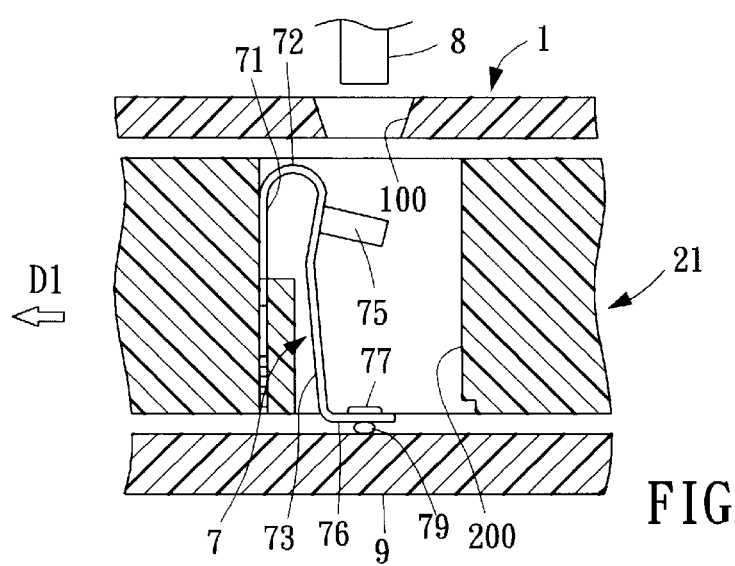

Referring to FIGS. 9A to 9C, each contact 7 is retained in the corresponding second passageway 200 of the daughter housing 21, whereby the barbs 74 thereof interferentially engage with opposite inner walls of the second passageway 200. A solder ball 79 is solderably attached to the concave side of the dimple 77 and is then soldered to a printed circuit board 9.

After the socket is fixed to the printed circuit board 9, the cam lever 3 is operated from the tightened status to the loosened status, and the relative position of the contact 7 with respect to the inner periphery of the second passageway 200 is changed from the position of FIG. 9C to the position of FIG. 9A. When the socket is operated from the tightened status to the loosened status, the contact 7 will experience a neutral status as shown in FIG. 9B, wherein the contact 7 substantially remains the same as it is in FIG. 8, i.e., the contact 7 is subject to non-deformation at this moment. An arrow D1 shown in FIGS. 9C and 9B represents the direction of movement of the daughter housing 21 (also suitable for another daughter housing 22 which is not shown in this figure). The mother housing 1 and the printed circuit board 9 do not move from FIG. 9C through FIG. 9B to FIG. 9A. In FIG. 9C, the socket is at a tightened status whereby the contacting portion 75 of the contact 7 blocks an insertion path of a CPU pin 8, therefore the CPU pin 8 can not be inserted into the socket with zero insertion force. In FIG. 9A, the socket is at a loosened status whereby the contacting portion 75 of the contact 7 does not block the insertion path of the CPU pin 8, therefore the CPU pin 8 can be inserted into the socket with zero insertion force. The first passageway 100 is a tapered hole for facilitating insertion of the CPU pin 8 thereinto.

The contact 7 is subject to deformation during both the tightened status and the loosened status, i.e., the contact 7 is subject to stress during both status's. When the socket is at the loosened status as shown in FIG. 9A, the stress levels of different parts of the contact 7 are different. For example, stress levels from high to low according to a finite element analysis are in the following sequence: the junction between the compliant section 73 and the soldering tail 76, the curved section 72 (including the junctions respectively formed between the compliant section 73 and the engagement section 71), the lower portion 73A of the compliant section 73, the upper portion 73B of the compliant section 73, and the soldering tail 76. Compared to the other portions listed above, the soldering tail 76 receives a relatively small amount of stress, thus, the soldering effect may be maintained. Moreover, the problem due to different coefficients of thermal expansion between the daughter housing 21 and the printed circuit board 9 may also be effectively resolved by the specific structure of the contact 7.

Figure 10A:
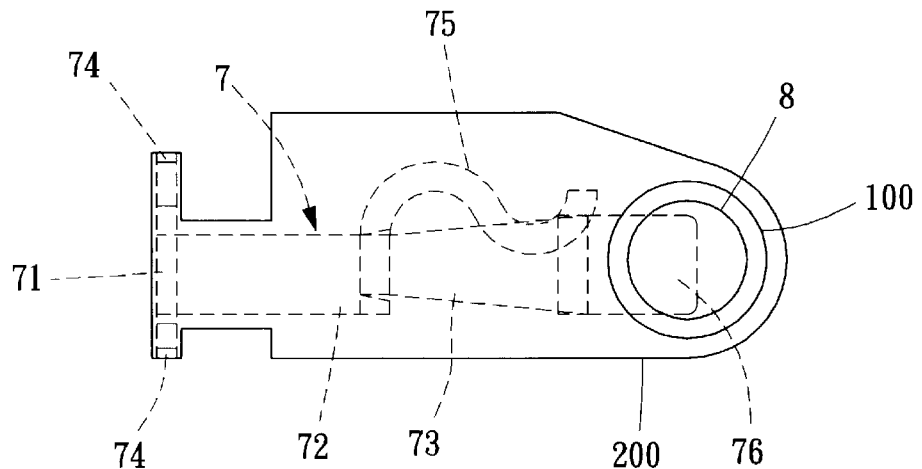
FIGS. 10A to 10C are schematic top views showing the relationship between the contact and a CPU pin.
Figure 10B:
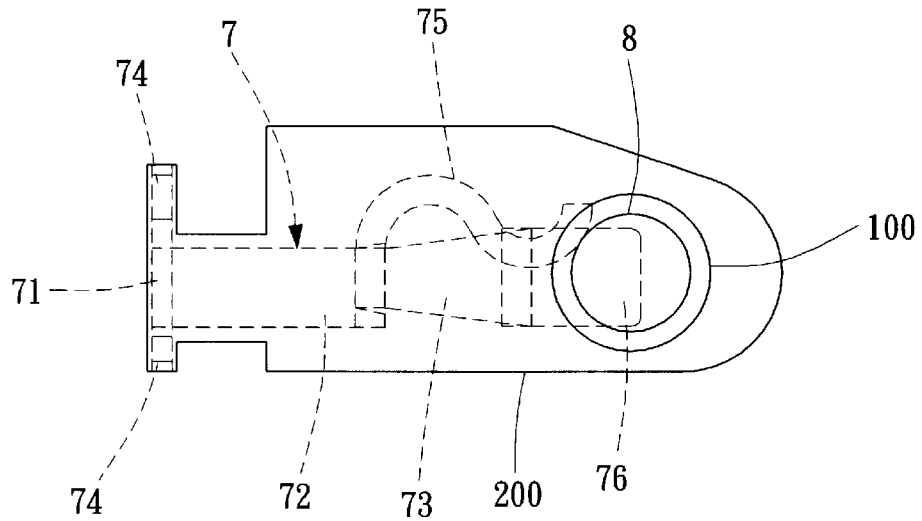
Figure 10C:
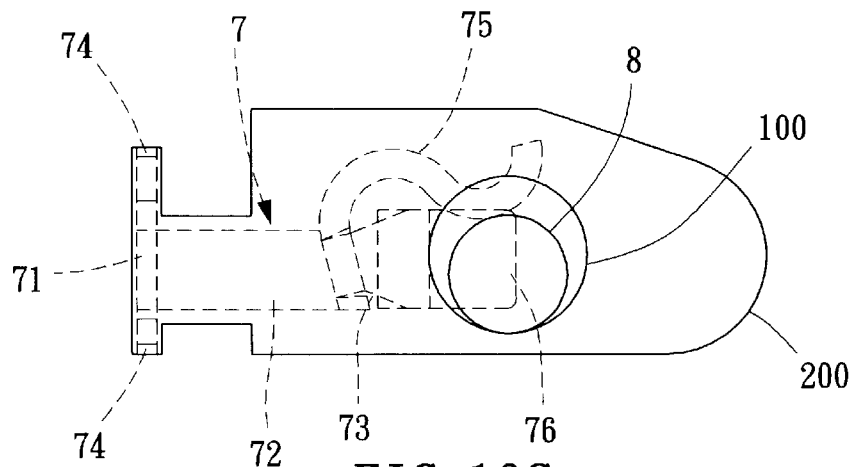
Figure 11A:
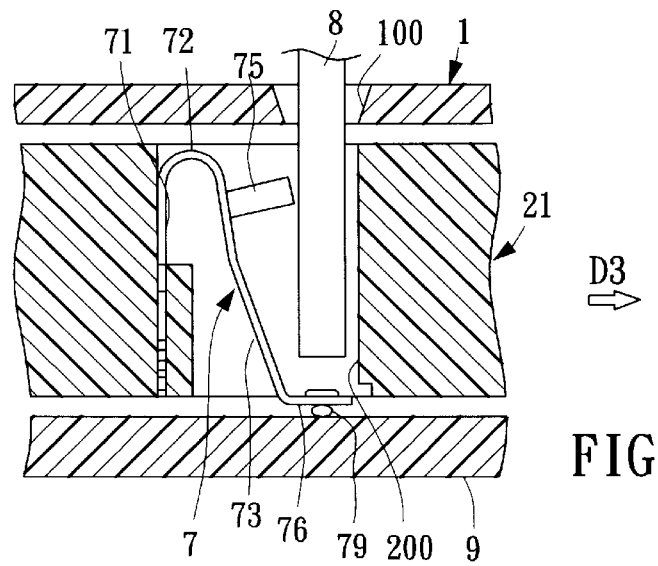
FIGS. 11A to 11C are schematic side views showing the relationship between the contact and a CPU pin.
Figure 11B:
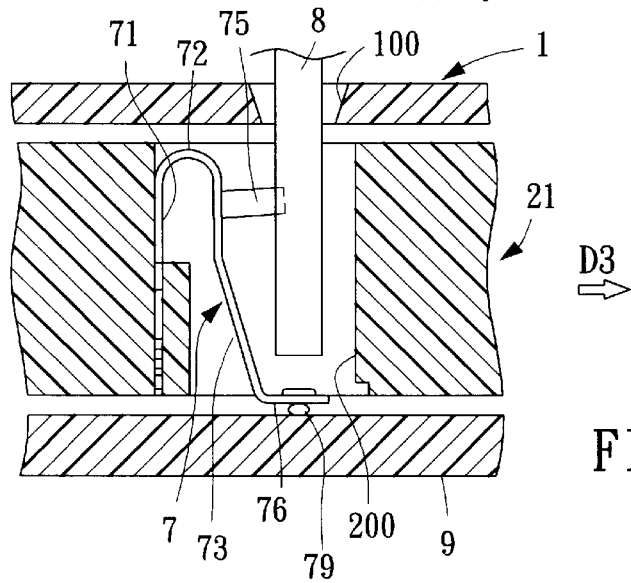
Figure 11C:
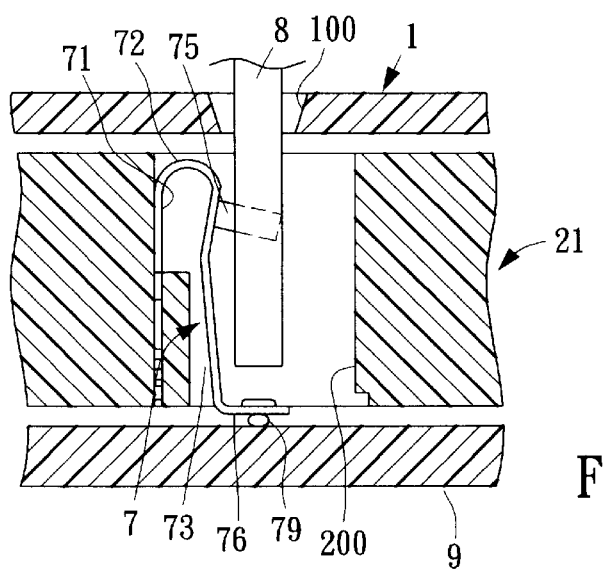

FIGS. 10A to 10C and 11A to 11C illustrate that the CPU pin 8 extending from a CPU or a CPU module (not shown) is partially received in the first passageway 100 of the mother housing 1 and the second passageway 200 of the daughter housing 21, wherein FIGS. 10A and 11A correspond with FIG. 9A. The CPU (or CPU module) rests on the mother housing 1 and substantially remains stationary when the daughter housing 21 is moved by the cam 32 from a first relative position shown in FIG. 11A to a second relative position shown in FIG. 11C.

Referring to FIGS. 10B and 11B, the contacting portion 75 of the contact 7 is moved by the daughter housing 21 along a direction D3 and approaches the CPU pin 8. Referring to FIGS. 10C and 11C, the contacting portion 75 of the contact 7 is continuously moved by the daughter housing 21 along the direction D3 to substantially contact the CPU pin 8 and is deformed thereby. Particularly referring to FIG. 10C, the CPU pin 8 is biased by the contacting portion 75 of the contact 7 due to a normal force therefrom thereby guaranteeing electrical connection therebetween.

When the socket is at the tightened status as shown in FIGS. 10C and 11C, the stress levels of different parts of the contact 7 are different. For example, stress levels from high to low according to a finite element analysis are in the following sequence: the junction between the upper portion 73B of the compliant section 73 and the contacting portion 75, the junction between the upper portion 71B of the engagement section 71 and the curved section 72, the junction between the compliant section 73 and the soldering tail 76, the junction between the upper and lower portions 73A, 73B of the compliant section 73, the curved section 72, the upper portion 73B of the compliant section 73, the lower portion 73A of the compliant section 73, the contacting portion 75, and the soldering tail 76. Compared to the other portions, the soldering tail 76 receives a relatively small amount of stress, therefore, the soldering effect may be maintained during the tightened status.

Figure 12:
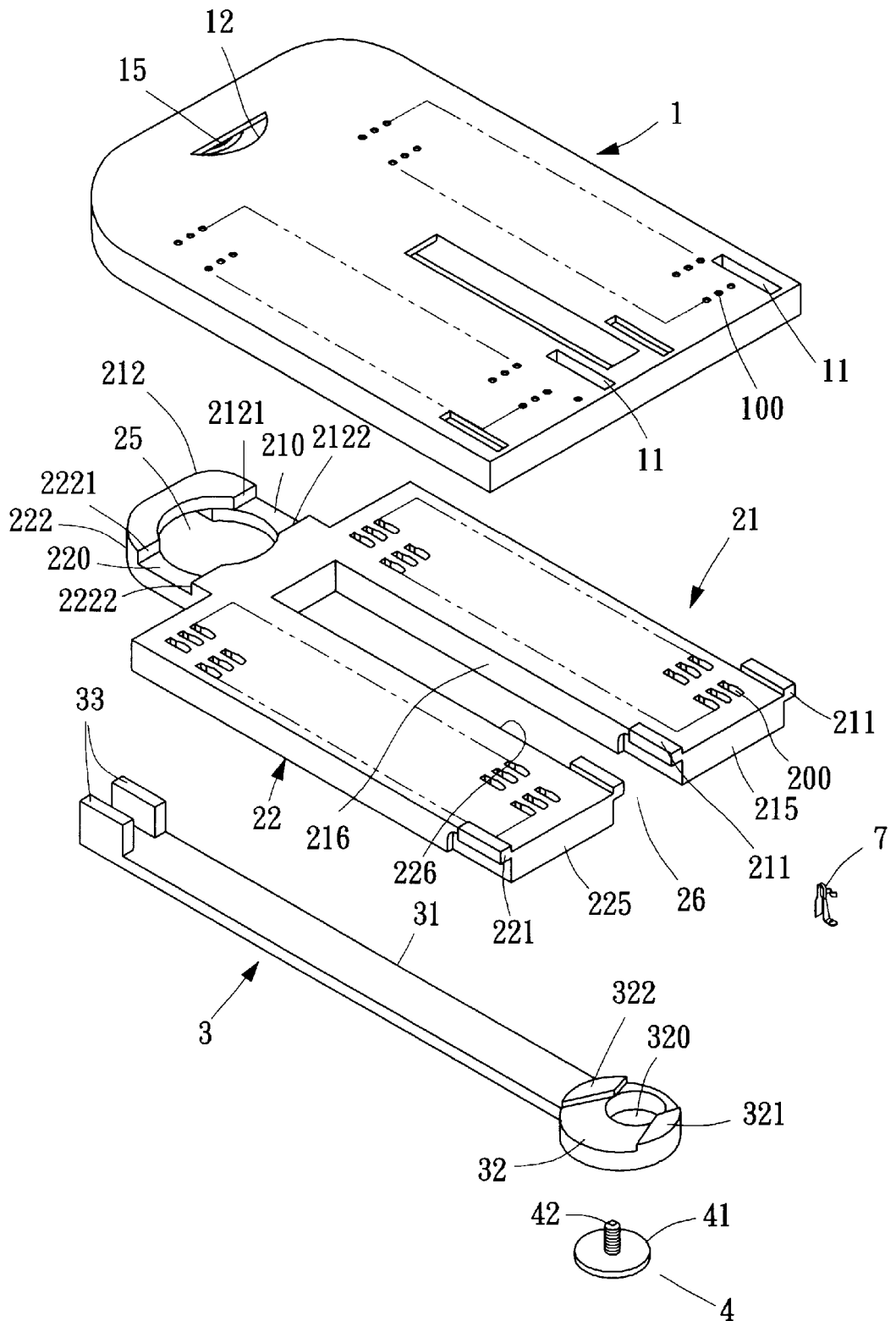
FIG. 12 is an exploded view of a ZIF PGA socket in accordance with a second embodiment of the present invention.

Referring to FIG. 12, a second embodiment of the present invention is shown, wherein most parts are exactly the same as those shown in the first embodiment (FIG. 1), except the daughter housings. In the second embodiment, the daughter housings 21, 22 of the first embodiment is integrated as a single housing during manufacturing and functions as well as in two pieces. Since the one-piece daughter housing is identical to the configuration of the two-piece daughter housings 21, 22 as shown in FIG. 1, the detailed function thereof is omitted herein because it is exactly the same as that described in the first embodiment.

The feature of the invention includes provision of the stationary mother housing 1 and a moveable daughter housing 21 (22) operated by a cam lever 3 wherein the lever 3 includes cam means 32 eccentric to the rotation center, i.e., the pivot 15 of the mother housing 1 thereby actuating the daughter housing 21 (22) to move linearly with regard to the mother daughter 1, and further includes block means 321, 322 defining engagement faces 323, 324 for respectively abutting against the inner side 141 or the outer side 142 of the beam 14 of the mother when the can lever 3 is rotated to two opposite outermost positions thereby limiting the rotation range of the cam lever 3. This operation and the corresponding structures all occur around the head portion of the connector and the mother housing 1, the daughter housing 21 (22) and the cam lever 3 are mingled with each other around such a head portion, thus achieving a low profile compact size of the whole connector set.

While the present invention has been described with reference to the above embodiments relating to the cam lever, the mother housing, and the daughter housings, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A ZIF PGA socket comprising
a mother housing having a first recess and a hole defined in an edge of the recess, a beam exposing to the hole and the recess and comprising a pivot extending therefrom;
two daughter housings slidably received in the first recess of the mother housing and each daughter housing comprising a C-shaped head portion extending out of the mother housing and defining a second recess for loosely receiving the beam of the mother housing, wherein the C-shaped head portions of the daughter housings are matingly configured to define a first reception space therebetween and together are movable along a same direction; and
a cam lever comprising a cam and a handle bar connected the cam, the cam being rotatably received in the first reception space between the daughter housings and defining a hole for rotatably receiving the pivot of the mother housing, a first block and a second block extending from the cam and spaced away by the hole of the cam and the beam of the mother housing for respectively driving the configured daughter housings to move in opposite directions when the handle bar is manually rotated in different directions;
whereby a moving plane of the daughter housings are parallel to a rotation plane of the handle bar.

2. The ZIF PGA socket as claimed in claim 1, wherein the mother housing has a U-shaped periphery wall formed around the recess thereof.

3. The ZIF PGA socket as claimed in claim 2, wherein each one of parallel longitudinal portions of the U-shaped periphery wall defines a first positioning hole.

4. The ZIF PGA socket as claimed in claim 3, wherein a first platform is formed in each parallel longitudinal portion of the U-shaped periphery wall and exposed to the first positioning hole so that the first positioning hole is not directly defined through the mother housing but partially blocked by the first platform.

5. The ZIF PGA socket as claimed in claim 4, wherein each daughter housing has a first engagement tab extending from one side thereof and slidably received in the first positioning hole of the mother housing, wherein the engagement tab is retained at a constant horizontal level by the platform formed in the first positioning hole of the mother housing.

6. The ZIF PGA socket as claimed in claim 1, wherein the mother housing has two parallel guiding ribs formed on the bottom of the recess.

7. The ZIF PGA socket as claimed in claim 2, wherein a rectangular space is defined between two opposite sides of the daughter housings when the heads thereof are combined with each other for slidably receiving the parallel guiding ribs of the mother housing.

8. The ZIF PGA socket as claimed in claim 7, wherein each one of the parallel ribs of the mother housing defines a second positioning hole.

9. The ZIF PGA socket as claimed in claim 8, wherein a second platform is formed in each rib and exposed to the second positioning hole so that the second positioning hole is not directly defined through the mother housing but partially blocked by the second platform.

10. The ZIF PGA socket as claimed in claim 9, wherein each daughter housing has a second engagement tab extending from one side thereof and slidably received in the second positioning hole of the mother housing, wherein the second engagement tab is retained at a constant horizontal level by the second platform formed in the second positioning hole of the mother housing.

11. The ZIF PGA socket as claimed in claim 1, wherein the head portions of the daughter housings each have a stepped edge for matingly configured with each other when the head portions are configured with each other.

12. The ZIF PGA socket as claimed in claim 1, wherein the two blocks of the cam each have a curved face substantially in alignment with a periphery portion of the cam for respectively driving the configured daughter housings to move in opposite directions parallel to the elongate direction of the parallel ribs of the mother housing.

13. The ZIF PGA socket as claimed in claim 1, wherein the first block of the cam has a first face and a second face integrated with each other by an obtuse angle proximating to the beam of the mother housing and the second block of the cam has a third face and a fourth face integrated with each other by an obtuse angle proximating to the beam of the mother housing.

14. The ZIF PGA socket as claimed in claim 1, wherein the first face of the first block is parallel to the fourth face of the second block and the second face of the first block is parallel to the third face of the second block.

15. The ZIF PGA socket as claimed in claim 1 further comprising a stud for pivotably fixing the cam to the pivot of the mother housing.

16. The ZIF PGA socket as claimed in claim 1 further comprising a post retained in a reception hole of the mother housing for positioning the mother housing on a printed circuit board.

17. A ZIF PGA socket comprising a mother housing having a first recess and a hole defined in an edge of the recess, a beam exposing to the hole and the recess and a pivot extending from the beam;

a daughter housing slidably received in the first recess of the mother housing and comprising a head portion in which a reception hole is defined and two second recesses are defined in line at two opposite periphery portions of the reception hole for movably receiving the beam of the mother housing; and a cam lever comprising a cam and a handle bar connected to the cam, the cam being rotatably received in the reception hole of the daughter housing and defining a hole for rotatably receiving the pivot of the mother housing, a first block and a second block extending from the cam and spaced away by the hole of the cam and the beam of the mother housing for respectively driving the daughter housing to move in opposite directions when the handle bar is manually operated in different directions; whereby a moving plane of the daughter housings are parallel to a rotation plane of the handle bar.

* * * * *